US006924585B2

(12) United States Patent
Goodson

(10) Patent No.: US 6,924,585 B2

(45) Date of Patent: Aug. 2, 2005

(54) SLEEVED ULTRASONIC TRANSDUCER

(75) Inventor: J. Michael Goodson, Skillman, NJ (US)

(73) Assignee: The Crest Group, Inc., Trenton, NJ (US)

(*) Notice: Subject to any disclaimer, the term of this patent is extended or adjusted under 35 U.S.C. 154(b) by 0 days.

(21) Appl. No.: 10/667,116

(22) Filed: Sep. 19, 2003

(65) Prior Publication Data

US 2004/0124745 A1 Jul. 1, 2004

Related U.S. Application Data

(60) Provisional application No. 60/501,236, filed on Sep. 8, 2003, and provisional application No. 60/413,069, filed on Sep. 23, 2002.

(51) Int. Cl.[7] ................................................ H01L 41/08

(52) U.S. Cl. ...................................................... 310/325

(58) Field of Search ....................... 310/323.01, 323.12, 310/323.16, 325

(56) References Cited

U.S. PATENT DOCUMENTS

| | | | | | |
|---|---|---|---|---|---|
| 3,230,403 | A | * | 1/1966 | Lewis et al. | 310/334 |
| 3,575,383 | A | | 4/1971 | Coleman | 259/72 |
| 3,681,627 | A | * | 8/1972 | Murry et al. | 310/325 |
| 4,129,850 | A | | 12/1978 | Mumper | 340/10 |
| 4,173,725 | A | * | 11/1979 | Asai et al. | 310/325 |
| 4,219,889 | A | | 8/1980 | Parssinen et al. | 367/158 |
| 4,495,433 | A | | 1/1985 | Sheridan | 310/329 |
| 4,633,119 | A | | 12/1986 | Thompson | 310/325 |
| 4,779,020 | A | * | 10/1988 | Konno et al. | 310/325 |
| 4,996,674 | A | * | 2/1991 | Thompson | 367/158 |
| 5,748,566 | A | | 5/1998 | Goodson | 367/158 |
| 5,998,908 | A | | 12/1999 | Goodson | 310/325 |
| 2001/0001123 | A1 | | 5/2001 | Madan et al. | 606/169 |

FOREIGN PATENT DOCUMENTS

| | | | |
|---|---|---|---|
| EP | 0 749 900 A1 | 12/1996 | B65B/51/22 |
| JP | 3-150080 | 6/1991 | H02N/2/00 |

OTHER PUBLICATIONS

J.C. Adamowski et al., "Combination of analytical and finite element methods to obtain acoustic fields in complex structures driven by piezoelectric multi–layered transducers," *1997 Proceedings of IEEE Ultrasonics Symposium* (*Toronto, Ontario, Canada*), Oct. 5, 1997; pp. 955–958.

In PCT Application No. PCT/US03/29637, filed Sep. 22, 2003, copy of Supplementary European Search Report, search completed Nov. 11, 2004, 4 pages in length.

* cited by examiner

*Primary Examiner*—Mark Budd

(74) *Attorney, Agent, or Firm*—Stallman & Pollock LLP

(57) ABSTRACT

A sleeved ultrasonic transducer has a two-part head mass, including a threaded sleeve and an outer housing that are composed of different materials. The threaded sleeve is preferably a metal such as titanium that provides superior thread strength for mating with a compression bolt, while the outer housing is preferably aluminum or ceramic or other metal or non-metallic material that provides good thermal heat sink capacity and/or transmission of vibrational energy. The combination of the two components provides an improved ultrasonic transducer.

26 Claims, 10 Drawing Sheets

SLEEVED ULTRASONIC TRANSDUCER

RELATED APPLICATIONS

This application claims priority from U.S. Provisional Application No. 60/413,069, filed Sep. 23, 2002, entitled SLEEVED ULTRASONIC CONVERTER; and U.S. Provisional Application No. 60/501,236, filed Sep. 8, 2003, entitled QUARTZ TANK WITH BONDED ULTRASONIC TRANSDUCER, both invented by J. Michael Goodson. Each of these disclosures is expressly incorporated herein by reference.

BACKGROUND OF THE INVENTION

1. Field of the Invention

This invention relates generally to ultrasonic generators, transducers, and converters, and relates more particularly to an ultrasonic transducer or converter having a two-piece head mass or front driver, where one piece provides good thread integrity and the other piece provides good acoustic and/or heat transfer properties.

2. Description of the Relevant Art

Typical prior art stacked ultrasonic transducers or converters 10 and 12 are shown in FIGS. 1 and 2. Both transducers 10 and 12 have multiple PZTs 14 (piezoelectric crystals or transducers), which are annular in shape and are located between a tail mass or back driver 16 and a head mass or front driver 18 (FIG. 1) or 20 (FIG. 2). A bolt 22 is threaded into internal threads in the head mass 18 or 20 to hold the converter together and to compress the PZTs 14 between the head mass and tail mass. An insulating sleeve 23 electrically insulates the PZTs 14 from the bolt 22, and electrical contacts 25 provide electrical connections to the PZTs. A threaded extension 24 connects the converter to a booster or horn (not shown) used for ultrasonic welding or similar application. The PZTs operate in thickness mode, which means they expand and contract primarily in the direction of the central axis 26 of the transducer. The head mass 18 or 20 is tapered in order to amplify the amplitude of the vibrations of the PZTs 14.

In FIG. 1, the head mass 18 is a single material such as aluminum or titanium. Aluminum has an advantage in that it has a high thermal capacity which is useful as a heat sink for transferring heat away from the PZTs. However, aluminum is a relatively soft metal and the screw threads needed to retain the bolt 22 and threaded extension 24 are correspondingly weak. Titanium has superior material strength and thread strength as compared to aluminum, but has a lower thermal capacity and cannot absorb heat as effectively as aluminum.

The transducer 12 shown in FIG. 2 substitutes titanium for aluminum in the threaded area of the head mass. The two-piece head mass 20 is composed of aluminum in the proximal piece 28 next to the PZTs 14 and is composed of titanium in the distal piece 30 that contains internal threads to mate with the bolt 22 and the threaded extension 24. A disadvantage of such a two-piece head mass design is that it does not perform as well as a single-piece head mass (FIG. 1) because having two materials interferes with the amplitude gain of the tapered head mass and the transmission of ultrasonic vibrational energy from the PZTs to the booster or horn.

In other applications, an ultrasonic transducer may be attached to a surface to which ultrasonic vibrational energy is to be transferred. For example, the surface may be the outside surface of a tank holding a cleaning solution and in which objects to be cleaned ultrasonically are immersed. In such an application, the ultrasonic transducer may be adhesively bonded to the tank surface. However, if the material of the tank and that of the head mass are different, there may be a mismatch in the coefficients of thermal expansion, which can cause failure of the adhesive bond. The tank may be made of quartz and the head mass of the transducer may be made of aluminum, which have significantly different coefficients of thermal expansion.

SUMMARY OF THE INVENTION

In summary, the present invention is a sleeved ultrasonic transducer comprising a threaded sleeve for one part of the head mass and an outer housing of a different material for the other part of the head mass. Since the head mass is composed of two parts, they can be made of different materials, each selected to optimize a different property or function. The threaded sleeve is preferably metal such as titanium that provides superior thread strength for mating with the bolt and threaded extension, if any, while the outer housing is preferably aluminum or ceramic that provides good thermal heat sink capacity and/or transmission of vibrational energy. The combination of the two components provides an improved ultrasonic transducer.

More specifically, the ultrasonic transducer of the present invention includes one or more disk-shaped piezoelectric crystals, wherein each piezoelectric crystal has an axial hole; a tail mass positioned on one side of the piezoelectric crystals, wherein the tail mass includes an axial hole; a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass. The head mass includes two pieces composed of different materials, including a threaded sleeve that has the internally-threaded axial hole and has a reduced diameter section and further including an outer housing that is axially outside the reduced diameter section of the threaded sleeve.

Preferably, the threaded sleeve and the outer housing have mating contact surfaces on a plane perpendicular to an axis of the transducer. Also preferably, an outer diameter of the reduced diameter section of the threaded sleeve is substantially equal to an inner diameter of the one or more piezoelectric crystals.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter. For example, the specification uses the terms transducer, converter, and generator interchangeably to refer to a device that generates ultrasonic vibrations in response to an electrical driving signal. The term piezoelectric crystal is used interchangeably with the terms piezoelectric transducer and PZT. Also, the terms head mass and front driver are used interchangeably to refer to the portion of the transducer (or converter or generator) through which the ultrasonic vibrational energy passes to the object of interest. Likewise, the terms tail mass and back driver are used interchangeably to refer to the portion of the transducer (or converter or generator) that is opposite the head mass (or front driver) and that provides a mass to balance the vibrations of the piezoelectric crystals.

DETAILED DESCRIPTION OF THE PREFERRED EMBODIMENTS

Figure 1:
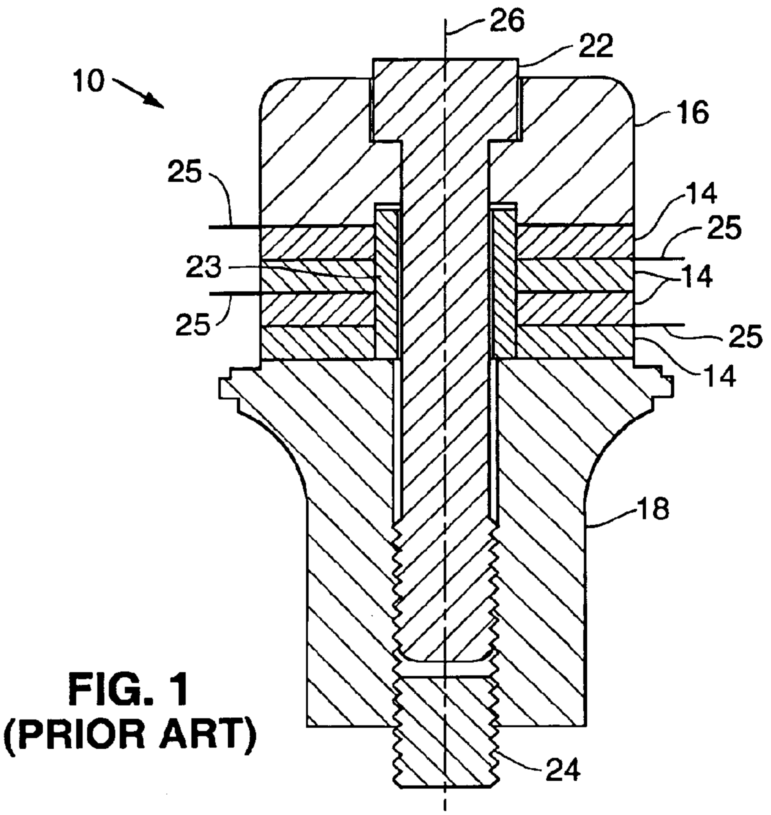
FIG. 1 (PRIOR ART)
FIG. 1 is a side sectional view of a prior art ultrasonic transducer having a head mass composed of a single metal material.

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

As shown in FIGS. 3–6, a sleeved ultrasonic transducer 40 according to the present invention has a two-piece head mass 42 that comprises an internally-threaded sleeve 44 of one material and a counterbored outer housing 46 of another material. Preferably, the threaded sleeve 44 is composed of a material, such as titanium or other metal, that has sufficient material strength for screw threads. Also preferably, the outer housing is composed of a material, such as aluminum, another metal, or ceramic or other non-metallic material, that provides advantageous thermal and/or acoustical properties, including thermal conduction, thermal expansion and/or efficient conduction of the vibrational energy generated by the PZTs (piezoelectric transducers or crystals) 14.

The threaded sleeve 44 has internal threads 48 that mate with external threads of the bolt 22 and the threaded extension 24. The outer housing 46 has a flat upper surface 50 that contacts the PZT stack and a counter bored hole 52 that nests or mates with a reduced diameter section 54 of the threaded sleeve 44. The outer housing 46 has a flat lower surface 56 that is perpendicular to the axis of the transducer and that contacts a shoulder 58 of the threaded sleeve 44. The bolt 22 compresses the PZTs 14 against the upper surface 50 of the outer housing 46 and compresses the lower surface 56 against shoulder 58 of the threaded sleeve 44. Axial vibrations from the PZTs 14 travel through the outer housing 46 and into the threaded sleeve 44 at the contact between the surface 56 of the outer housing and the shoulder 58 of the threaded sleeve.

The lower surface 56 of the outer housing 46 is preferably located in a cylindrical section 60 of the head mass, not in a tapered section 62. The amplitude gain of the head mass is fully developed in the tapered section 62 so that the vibrations in the cylindrical section 60 are axial. The transition between the two pieces of the head mass, where surface 56 butts against shoulder 58, is located at the cylindrical section so that the axial vibrations are transferred efficiently from the outer housing 46 to the threaded sleeve 44. Preferably, the outer diameter of the reduced diameter section 54 of the threaded sleeve is substantially the same as the inner diameter of the PZTs 14.

Figure 2:
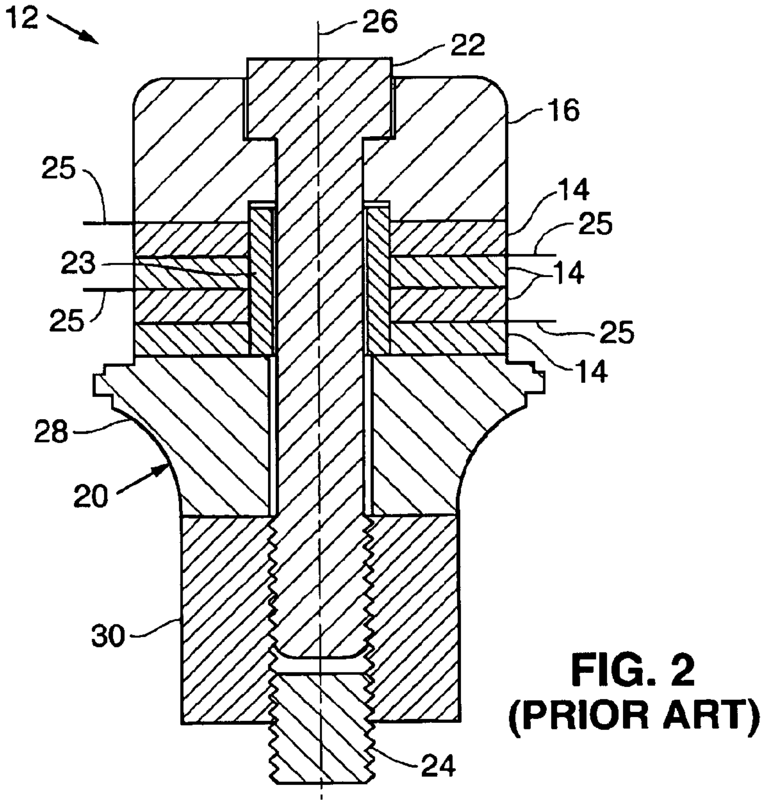
FIG. 2 (PRIOR ART)
FIG. 2 is a side sectional view of another prior art ultrasonic transducer, this one having a two piece head mass composed of two metal materials.
Figure 3:
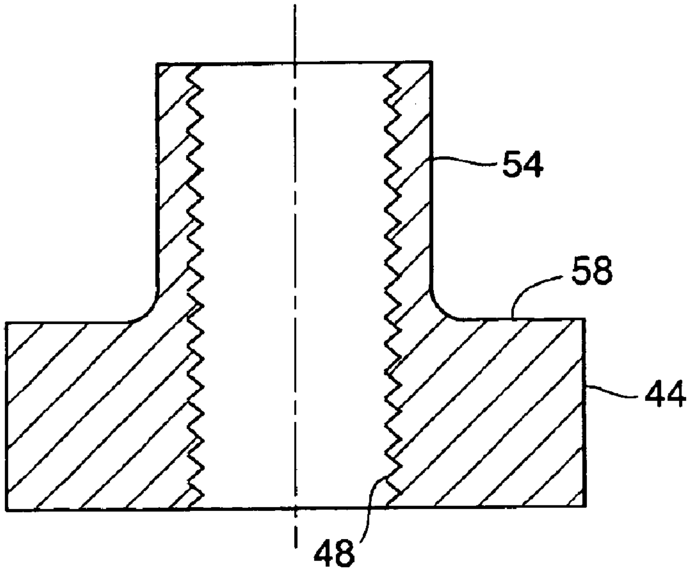
FIG. 3 is a side sectional view of a threaded sleeve of the head mass of a first embodiment of an ultrasonic transducer according to the present invention.
Figure 4:
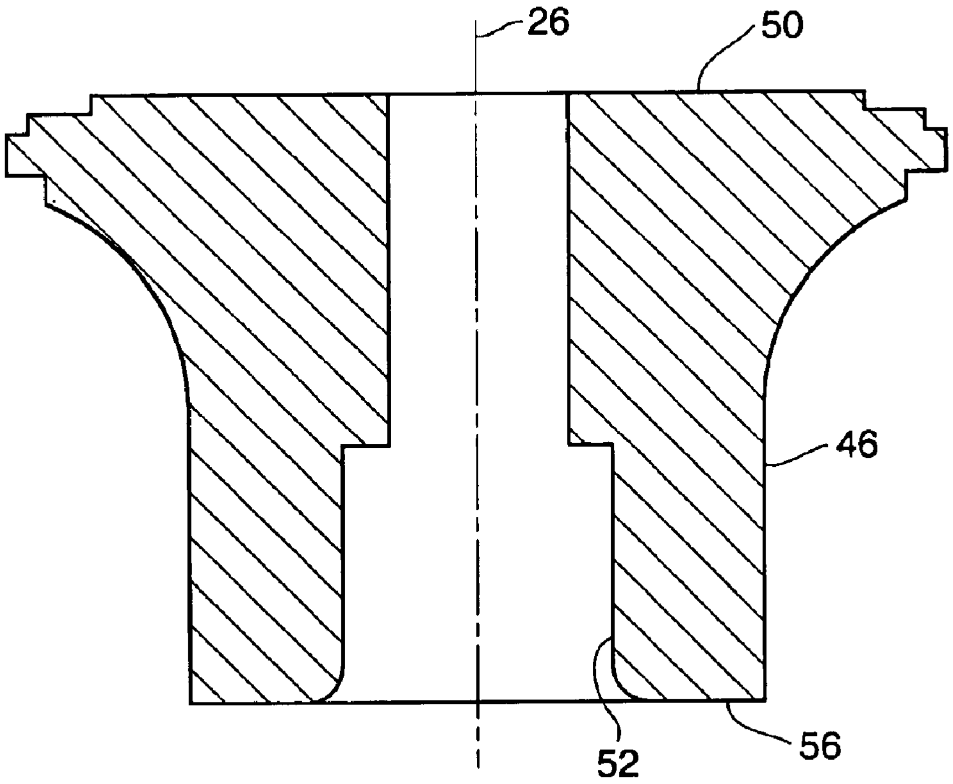
FIG. 4 is a side sectional view of an outer housing of the head mass of the first embodiment of an ultrasonic transducer according to the present invention.
Figure 5:
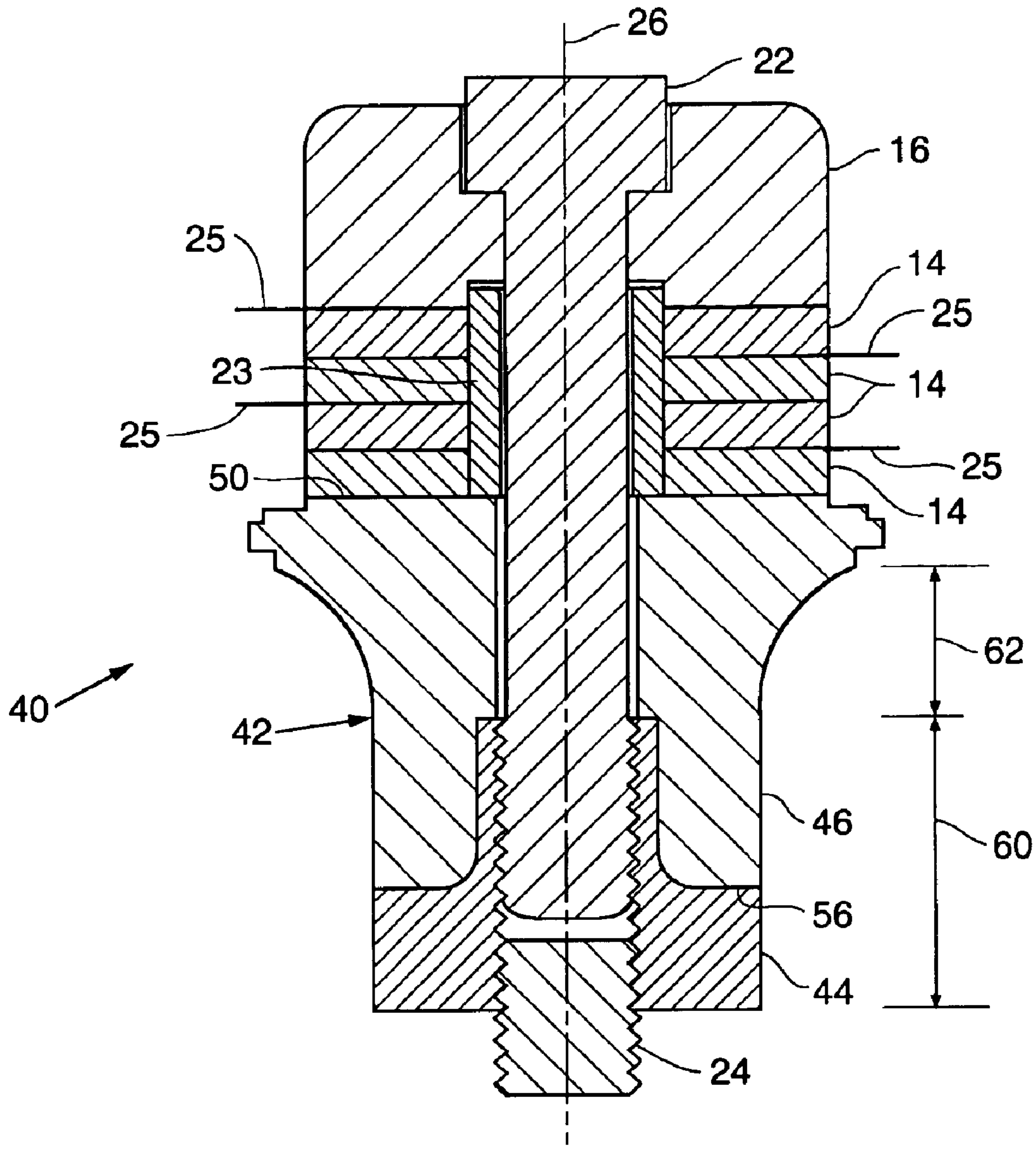
FIG. 5 is a side sectional view of a sleeved ultrasonic transducer according to the present invention, which uses the titanium sleeve of FIG. 3 and the aluminum housing of FIG. 4.
Figure 6:
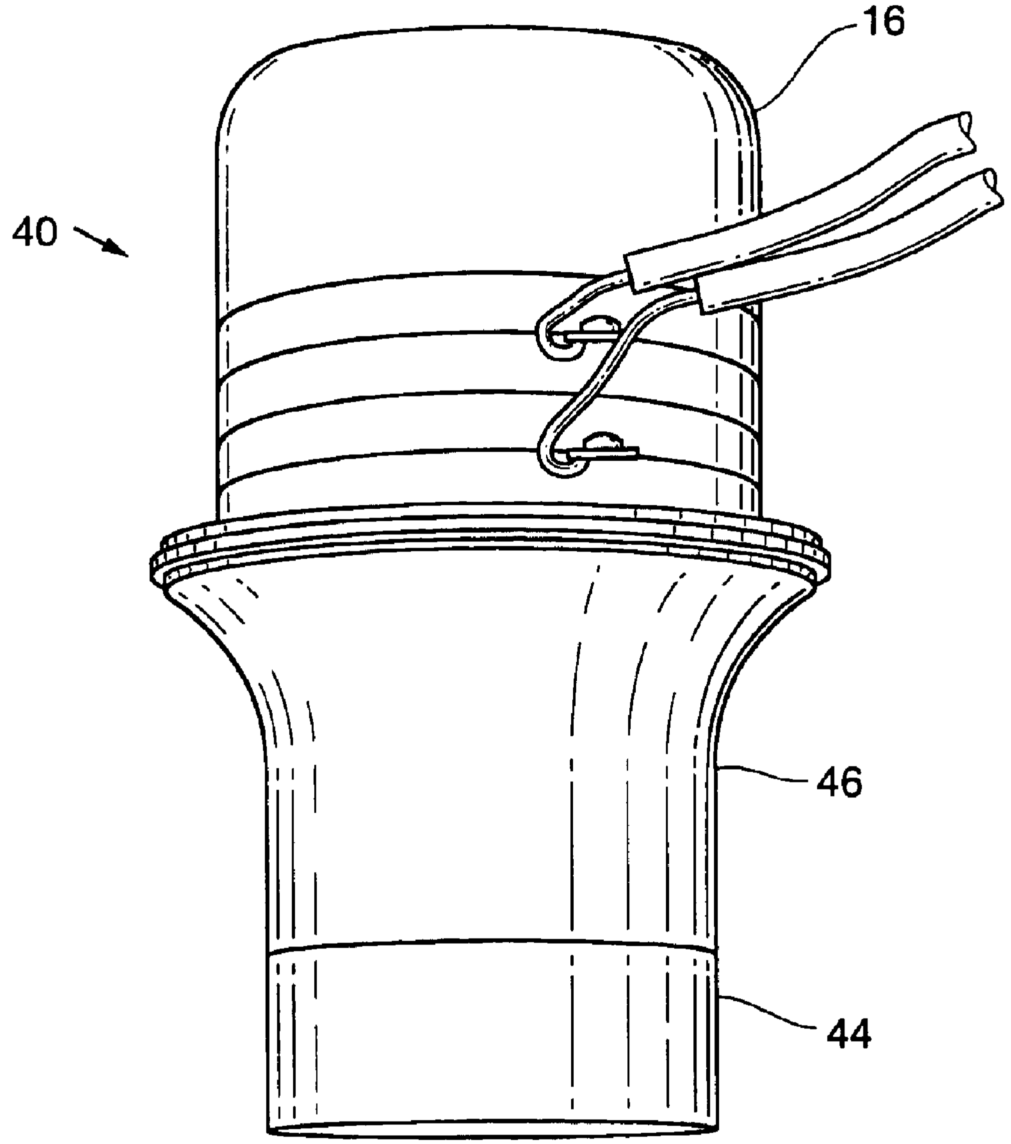
FIG. 6 is side view of the sleeved ultrasonic transducer of the transducer of FIG. 5.
Figure 7:
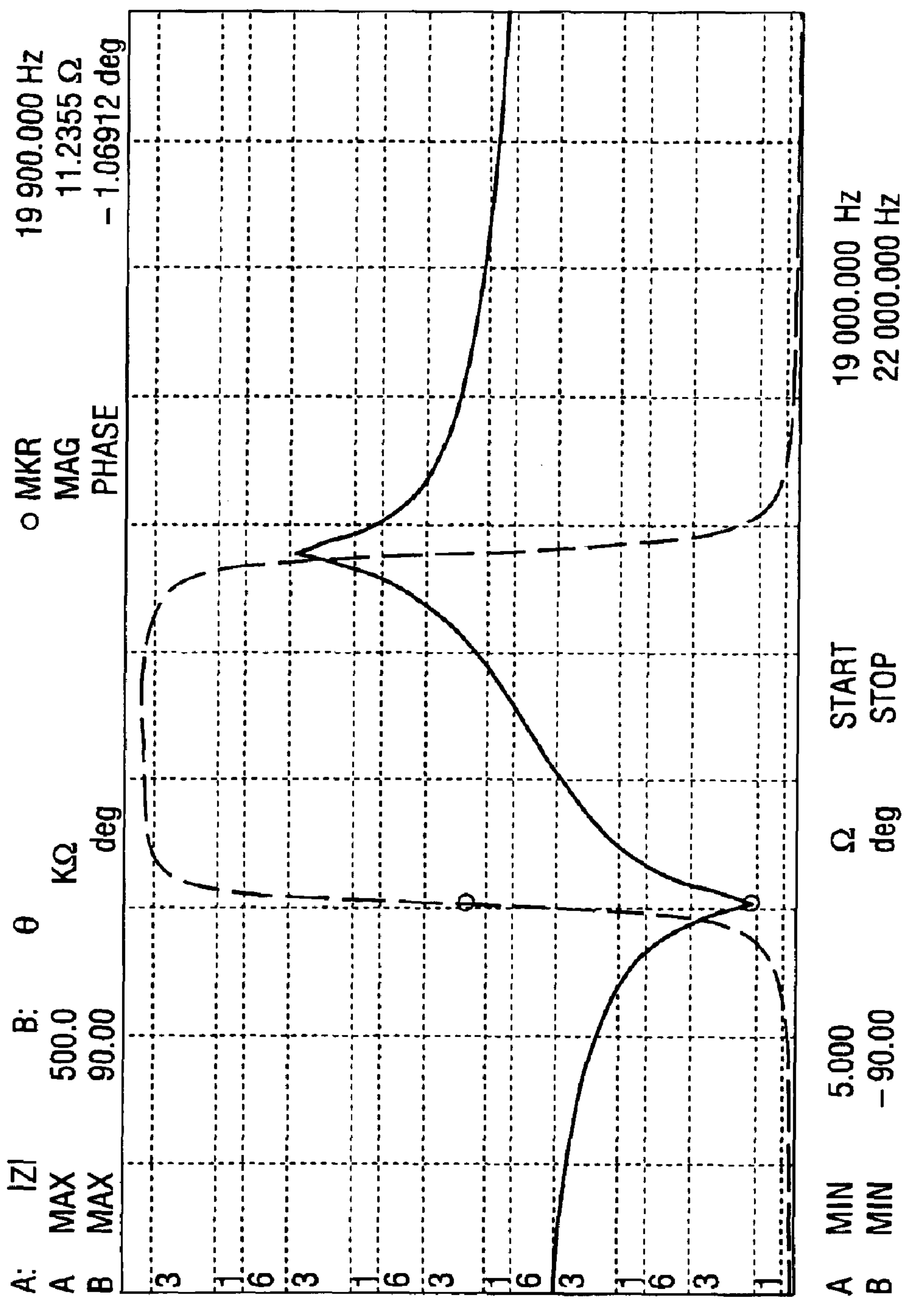
FIG. 7 is an impedance-frequency chart of a transducer with a two piece aluminum/titanium front driver as shown in FIG. 2.
Figure 8:
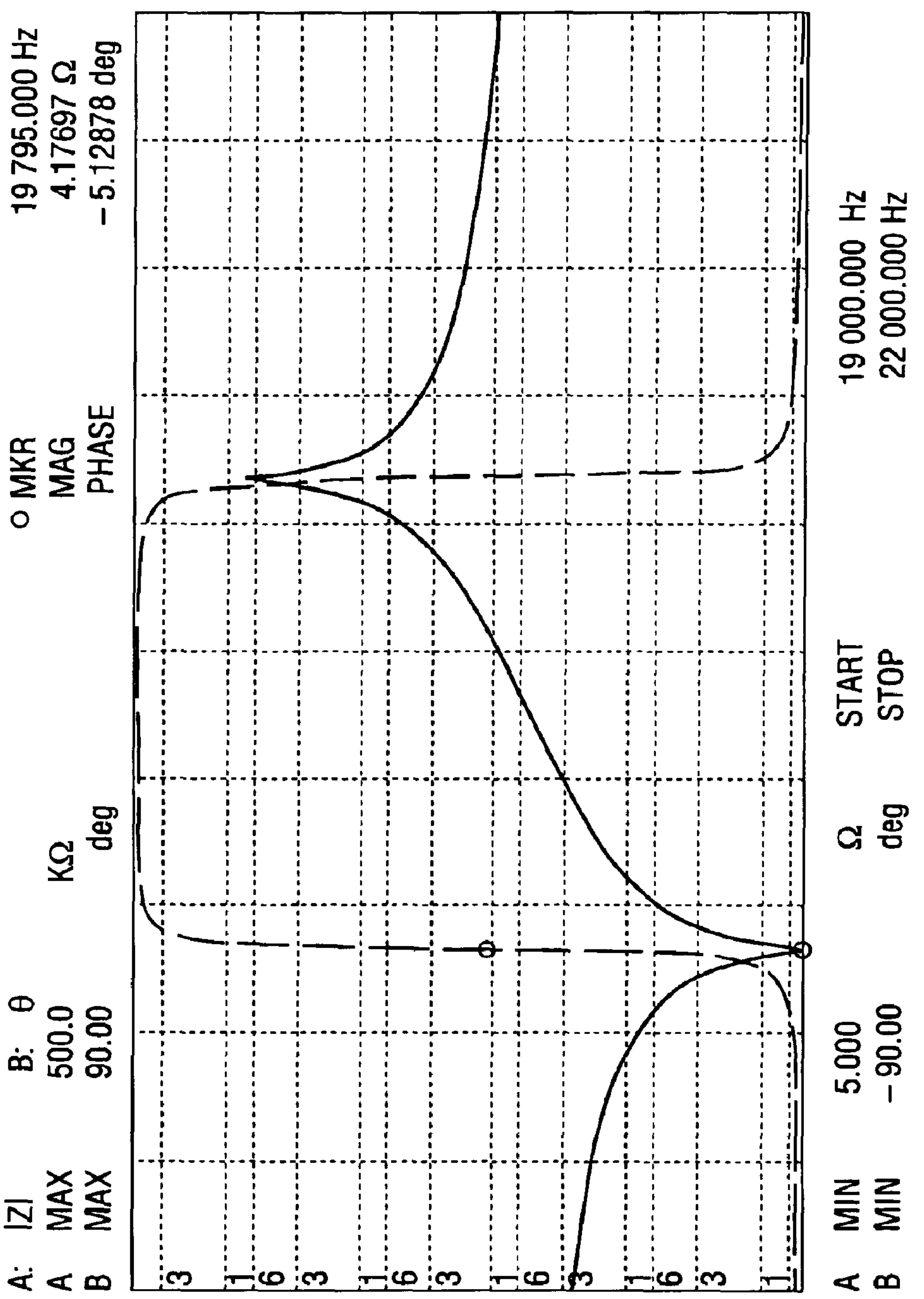
FIG. 8 is an impedance-frequency chart of the first embodiment of a sleeved ultrasonic transducer according to the present invention.

As compared to the prior ultrasonic transducer 12 with a two piece head mass 20 (FIG. 2), the sleeved ultrasonic transducer 40 of the present invention with an aluminum outer housing 46 and a titanium threaded sleeve 44 has more aluminum for better heat sinking and has a more effective transition of vibrations between the aluminum and titanium pieces. As shown in FIG. 7, the prior transducer 12 has a minimum impedance of 11.24 ohm, while FIG. 8 shows that such a sleeved transducer 40 of the present invention has an improved minimum impedance of 4.18 ohm.

As compared to the prior art one piece ultrasonic transducer 10 (FIG. 1), the sleeved ultrasonic transducer 40 of the present invention with an aluminum outer housing 46 and a titanium threaded sleeve 44 has better thread strength than an all-aluminum head mass and better thermal heat sinking than an all-titanium head mass. The combination of the titanium threaded sleeve 44 and aluminum outer housing 46 of the sleeved transducer 40 achieves acoustical performance equivalent to single-metal front drivers.

The outer housing may also be composed of a metal other than aluminum or a non-metallic material including ceramics such as silicon carbide, aluminum oxide, or other advanced ceramics. As used herein, the term "advanced ceramics" is intended to mean ceramic materials having a minute grain size of a few microns or a fraction of a micron and which also have very high density with near zero porosity as measured in microns. The grain structure is highly uniform allowing ultrasonic signals to move in every direction simultaneously. Silicon Carbide is a preferred form of advanced ceramic and is made from a chemical reaction with graphite. Using a ceramic material for the outer housing improves acoustic performance because ceramic is a better conductor of ultrasonic vibrational energy than aluminum and other metals, and may be preferred for that reason.

Figure 9:
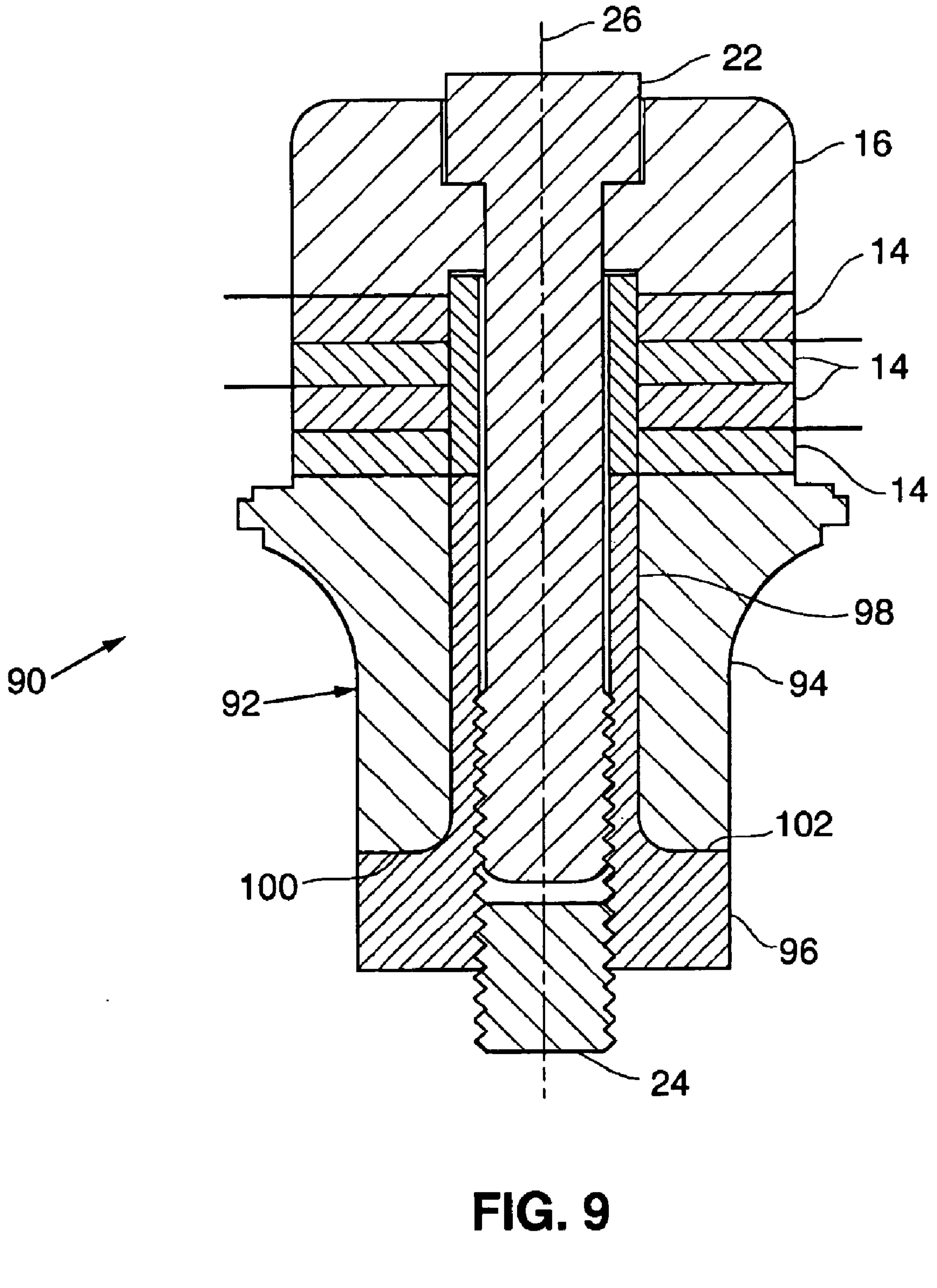
FIG. 9 is a side sectional view of another embodiment of a sleeved ultrasonic transducer according to the present invention, similar to the transducer of FIGS. 3–6.

FIG. 9 shows an alternative construction of the FIGS. 3–6 embodiment of the present invention. Transducer 90 has a head mass 92 that has an outer housing 94 and a threaded sleeve 96. A reduced diameter section 98 of the threaded sleeve 96 extends upwardly to the top of the outer housing 94. The outer housing 94 has an axial hole sized to accommodate the section 98 of the threaded sleeve 96. Preferably, the outer diameter of the reduced diameter section 98 of the threaded sleeve 96 is substantially the same as the inner diameter of the PZTs 14. Vibrational energy from the PZTs 14 is transferred to the outer housing 94, then downward to a bottom surface 100 of the outer housing to an upper surface 102 of the threaded sleeve 96. In other respects, the transducer 90 is the same as the transducer 40 described above.

Figure 10:
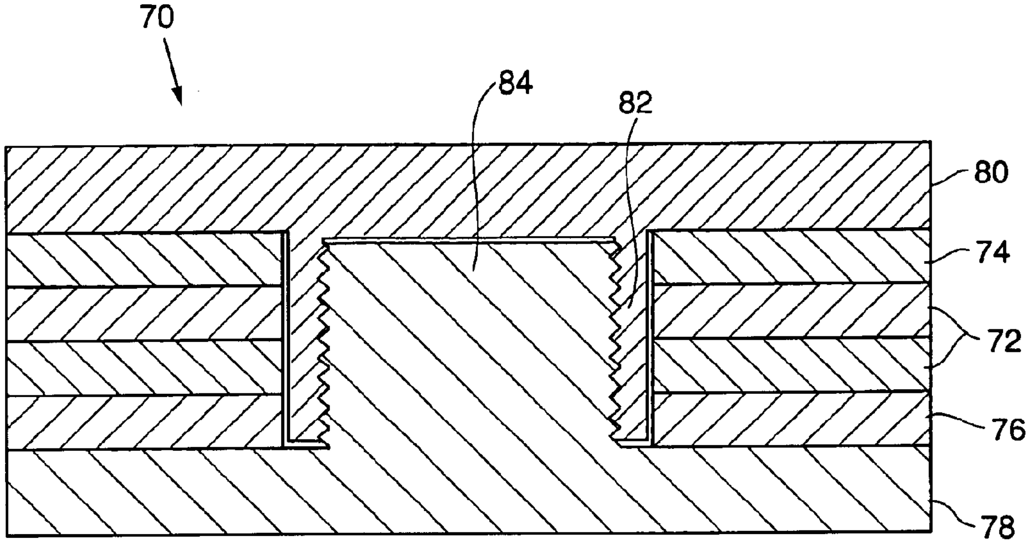
FIG. 10 is an alternative embodiment of a sleeved ultrasonic transducer according to the present invention.

FIG. 10 shows an alternative embodiment of the present invention for high frequency applications. An ultrasonic transducer 70 has two annular PZTs 72 in the middle of a stack, an annular disk 74 of aluminum oxide above the PZTs, an annular disk 76 of silicon carbide below the PZTs, a titanium head mass 78 and a titanium tail mass 80. The tail mass 80 has a threaded sleeve 82 that is internally threaded and that extends into the annular region of the transducer stack from above. The head mass 78 has an externally threaded member 84 that extends into the annular region of the transducer stack from below. The internally threaded sleeve 82 of the tail mass 80 mates with the externally threaded member 84 of the head mass 78 to secure the transducer stack and compress the PZTs 72 and disks 74 and 76 between the head mass and tail mass.

Figure 12:
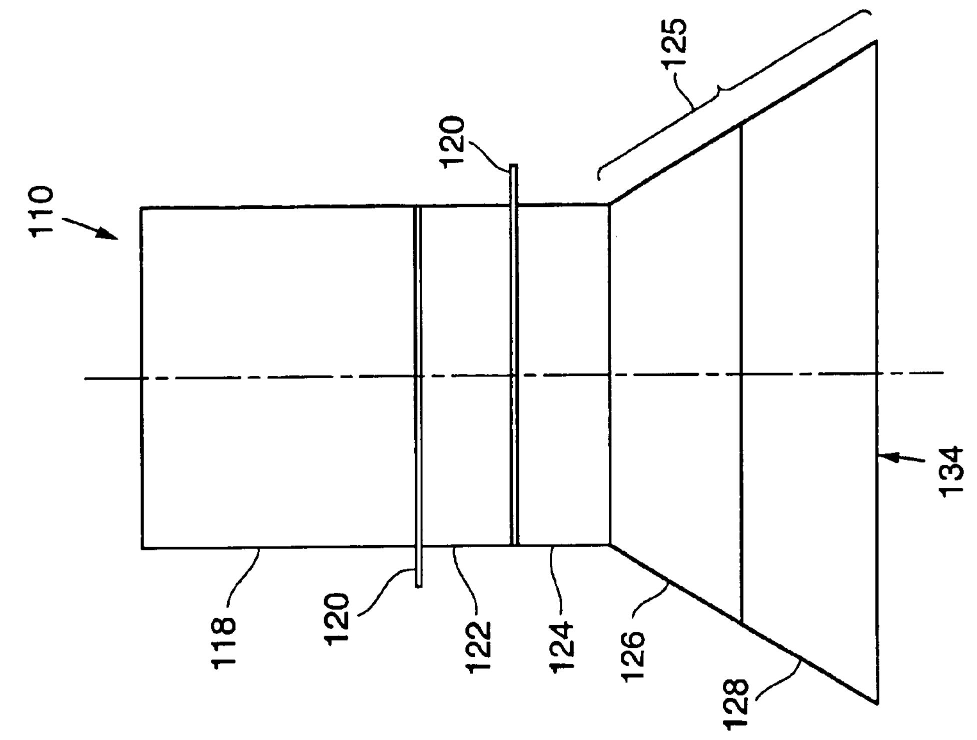
FIG. 12 is a side view the transducer of FIG. 11.
Figure 13:
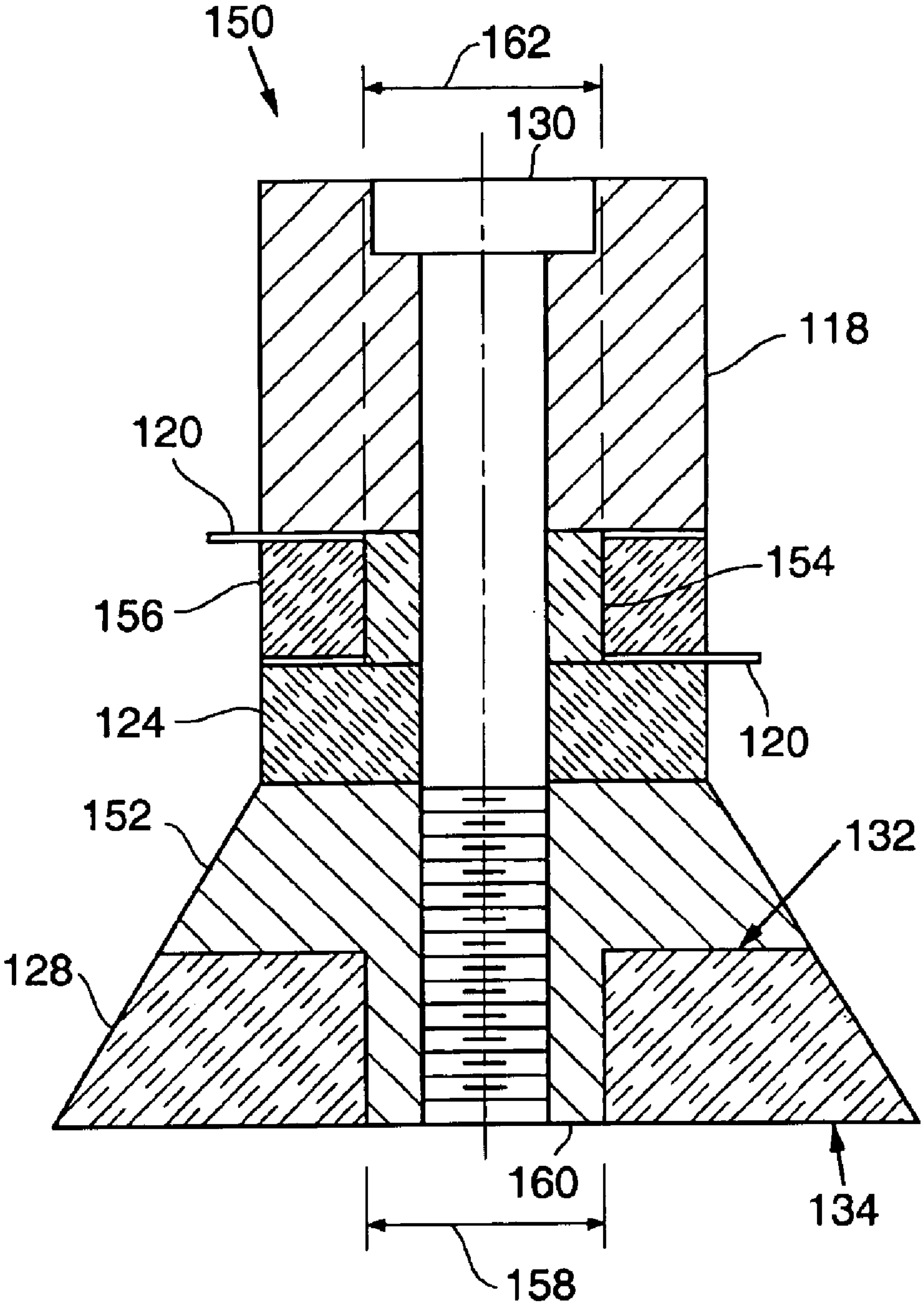
FIG. 13 is a side sectional view of another alternative embodiment of a sleeved ultrasonic transducer according to the present invention.

Another aspect of the present invention relates to an improvement in ultrasonic transducers used in cleaning systems, shown in FIGS. 12–13. More specifically, it has now been recognized that enhanced performance can be achieved by forming the tank or vessel out of quartz or an advanced ceramic material and by bonding the transducer directly onto a surface of the tank.

Ultrasonic transducers commonly used for cleaning operations have a stacked construction. A typical transducer has one or more piezoelectric crystals shaped in the form of a disk with an annular hole. The piezoelectric crystal is oriented so that expansion and contraction in response to applied electrical signals is axial in direction. On one side of the piezoelectric crystal is a tail mass and on the other side is a head mass. A screw or bolt compresses the piezoelectric crystal between the head mass and tail mass. The head mass is mounted on the tank and transmits vibrations from the piezoelectric crystal to the tank. The tail mass balances the displacements caused by the expansion and contraction of the piezoelectric crystal. In my prior U.S. Pat. Nos. 5,748,566 and 5,998,908, I disclosed an improvement to a stacked transducer construction, which added a resonator made of a ceramic material between the piezoelectric crystal and the head mass.

One problem to overcome in bonding a transducer to a cleaning tank is inconsistent material properties between the materials used for the tank and transducer. Head and tail masses are commonly made from metals, such as aluminum, which have a much higher coefficient of expansion than quartz or ceramics such as silicon carbide.

The present invention has a different construction for the transducer, which facilitates bonding of the transducer to a tank. Typically more than one transducer is mounted to a tank, either internally or externally. Commonly several transducers are mounted to the bottom of a cleaning tank. The tank contains a liquid and parts to be cleaned, rinsed, or otherwise processed using ultrasonics. The transducers are excited by an alternating current. Vibrations caused by the piezoelectric crystals of the transducers are transferred into the tank and through the liquid to the parts in the tank.

Figure 11:
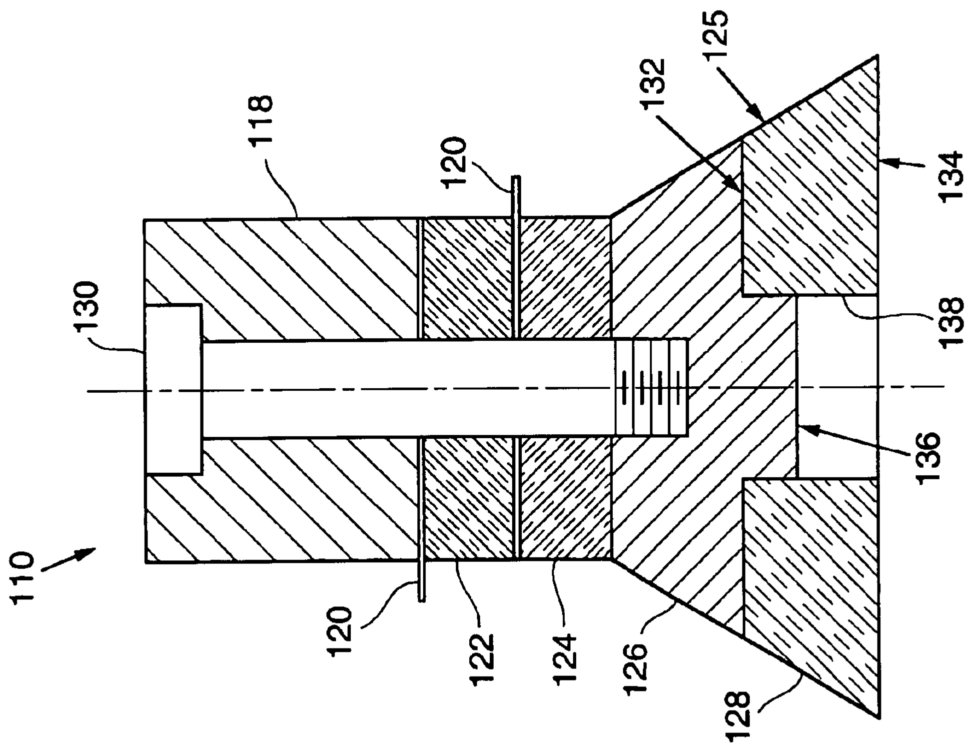
FIG. 11 is a side sectional view of another alternative embodiment of a sleeved ultrasonic transducer according to the present invention.

The construction of another embodiment of the transducer of the present invention is shown as transducer 110 in FIGS. 11 and 12. The components of the transducer 110, from the top, include a tail mass 118, electrode 120, piezoelectric crystal 122, electrode 120, ceramic resonator 124, and a head mass 125 that includes a threaded sleeve 126 and an outer housing 128. A bolt 130 is threaded into an internally threaded hole in the threaded sleeve 122 and compresses the electrodes 120, piezoelectric crystal 122 and ceramic resonator 124 between the tail mass 118 and the head mass 125. The outer housing 128 is preferably composed of silicon carbide or other ceramic material and is bonded to a flat surface 132 of the threaded sleeve 126. Preferably, the outer housing is composed of a metal or non-metallic material that has a coefficient of thermal expansion that is similar to the coefficient of thermal expansion of the material of the tank. Another flat surface 134 of the outer housing 128 is bonded to a surface of a cleaning tank. A protrusion 136 at the bottom of the threaded sleeve 126 mates with an axial hole 138 of the outer housing 128 to assist in positioning the threaded sleeve relative to the outer housing. All the parts of the transducer except the electrodes 120 are axially symmetrical. The tail mass 118 and threaded sleeve 126 are preferably composed of aluminum material, but may be made of other non-metallic materials or metals such as titanium if thread strength is an issue.

An alternative construction of the transducer 110 is shown in FIG. 13. Transducer 150 has a threaded sleeve 152 that extends downward to the bottom of the outer housing 128, which provides more thread area for the bolt 130 to engage. Also, transducer 150 has an insulated sleeve 154 inside the inner diameter of the PZT 156. Preferably, the outer diameter 158 of the lower protrusion 160 of the threaded sleeve 152 is substantially the same as the inner diameter 162 of the PZT 156. Such a construction may be more efficient in transferring the vibrational energy of the PZT through the outer housing 128 to the tank. Alternatively, the ceramic resonator 124 may have the same inner diameter as the PZT 156 with the insulated sleeve 154 extending downward to the top of the threaded sleeve 152.

One advantage of the construction of transducer 110 or 150 is that the outer housing 128 of the head mass can be made out of a metal or non-metallic material, such as silicon carbide, that has properties similar to those of the tank material, which may be quartz or silicon carbide or other advanced ceramic. Silicon carbide is a polycrystalline material. There are many grains in a silicon carbide ceramic, with grain size being a few micrometers (direct sintered). There are different forms of quartz, including fused quartz and single crystal quartz. Fused quartz is an amorphous (non-crystalline, or glass) material. Generally speaking, single crystal quartz is one big grain. It can be as big as several inches (with only one grain). Fused quartz is amorphous, so it does not contain any grains.

The coefficients of thermal expansion of glass and ceramic are isotropic, meaning that it is not direction dependent. The coefficient of thermal expansion of a single crystal quartz is anisotropic (direction dependent), meaning it varies with the crystal orientation. Generally speaking, the coefficient of thermal expansion of quartz single crystal is about 15–20 times bigger than fused quartz glass. The preferred type of quartz for cleaning tanks is fused quartz. The coefficients of thermal expansion (in units of $\mu$m/m-° C.) are 0.4 for fused quartz, 4.5 for silicon carbide, 17 for stainless steel, 9 for titanium, and 23–24 for aluminum.

By using silicon carbide instead of aluminum for the portion of the head mass that is bonded to a cleaning tank, the thermal mismatch is reduced significantly. The mismatch in thermal expansion between two bonded materials induces stresses within the material/boundary when there is a temperature change. The difference in thermal expansion coefficients between aluminum and fused quartz is about 60 times, compared to 10 times between silicon carbide and fused quartz.

The transducer 110 or 150 is bonded to a surface (exterior or interior) of the tank with an epoxy polymer adhesive Supreme 10AOHT. This epoxy contains a ceramic filler of aluminum oxide (alumina). It is a heat curing epoxy with high shear strength and high peel strength. It also is thermally conductive and resistant to severe thermal cycling. The same adhesive is used to bond the silicon carbide outer housing 128 to the aluminum threaded sleeve 126 or 152.

The use of silicon carbide in the head mass provides an ultrasonic transducer that can readily be bonded to a quartz or ceramic tank, which facilitates efficient transfer of ultrasonic vibrations from the transducer to the parts or items in the tank.

From the above description, it will be apparent that the invention disclosed herein provides a novel and advantageous sleeved ultrasonic transducer. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. An ultrasonic transducer, comprising:

one or more disk-shaped piezoelectric crystals, wherein each piezoelectric crystal has an axial hole;

a tail mass positioned on one side of the piezoelectric crystals, wherein the tail mass includes an axial hole;

a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass;

wherein the head mass includes two pieces composed of different materials, including a threaded sleeve that has said internally-threaded axial hole and has a reduced diameter section and further including an outer housing having an axial hole that mates with the reduced diameter section of the threaded sleeve.

2. An ultrasonic transducer as recited in claim 1 wherein the threaded sleeve and the outer housing have mating contact surfaces on a plane perpendicular to an axis of the transducer.

3. An ultrasonic transducer as recited in claim 1 wherein an outer diameter of the reduced diameter section of the threaded sleeve is substantially equal to an inner diameter of the one or more piezoelectric crystals.

4. An ultrasonic transducer as recited in claim 1 wherein the threaded sleeve is composed of titanium.

5. An ultrasonic transducer as recited in claim 1 wherein the threaded sleeve is composed of aluminum.

6. An ultrasonic transducer as recited in claim 1 wherein the outer housing is composed of aluminum.

7. An ultrasonic transducer as recited in claim 1 wherein the outer housing is composed of silicon carbide.

8. An ultrasonic transducer, comprising:

one or more disk-shaped piezoelectric crystals, wherein each piezoelectric crystal has an axial hole;

a tail mass positioned on one side of the piezoelectric crystals, wherein the tail mass includes an axial hole;

a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass;

wherein the head mass includes an outer housing proximal to the piezoelectric transducers and a threaded sleeve distal to the piezoelectric transducers, wherein the outer housing has an axial hole with clearance for the bolt and wherein the threaded sleeve includes the internally-threaded axial hole that mates with threads on the bolt, wherein the outer housing and threaded sleeve are composed of different materials, and wherein the outer housing has a counterbored hole and the threaded sleeve has a cylindrical sleeve portion that fits inside the counterbored hole of the outer housing.

9. An ultrasonic transducer as recited in claim 8 wherein the threaded sleeve and the outer housing have mating contact surfaces on a plane perpendicular to an axis of the transducer and wherein the sleeve portion of the threaded sleeve and the counterbored hole of the outer housing are proximal to the mating contact surfaces.

10. An ultrasonic transducer as recited in claim 8 wherein an outer diameter of the reduced diameter section of the threaded sleeve is substantially equal to an inner diameter of the one or more piezoelectric crystals.

11. An ultrasonic transducer as recited in claim 8 wherein the threaded sleeve is composed of titanium.

12. An ultrasonic transducer as recited in claim 8 wherein the outer housing is composed of aluminum.

13. An ultrasonic transducer as recited in claim 8 wherein the outer housing is composed of silicon carbide.

14. An ultrasonic transducer, comprising:

one or more disk-shaped piezoelectric crystals, wherein each piezoelectric crystal has an axial hole having an inner diameter;

a tall mass positioned on one side of the piezoelectric crystals, wherein the tail mass includes a threaded portion disposed within the inner diameter of the piezoelectric crystals;

a head mass positioned on a side of the piezoelectric crystals opposite the tall mass, wherein the head mass includes a threaded portion disposed within the inner diameter of the piezoelectric crystals, and wherein the threaded portions of the-tail mass and head mass engage and compress the piezoelectric crystals between the tall mass and head mass.

15. An ultrasonic transducer as recited in claim 14 wherein the head mass and tall mass are composed of titanium.

16. An ultrasonic transducer as recited in claim 14 further comprising an annular disk of silicon carbide positioned between the piezoelectric crystals and the head mass.

17. An ultrasonic transducer as recited in claim 14 further comprising an annular disk of aluminum oxide positioned between the piezoelectric crystals and the tail mass.

18. An ultrasonic transducer, comprising:

one or more disk-shaped piezoelectric crystals, wherein each piezoelectric crystal has an axial hole;

a tail mass positioned on one side of the piezoelectric crystals, wherein the tail mass includes an axial hole;

a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass;

wherein the head mass includes a threaded sleeve proximal to the piezoelectric transducers and an outer housing distal to the piezoelectric transducers, wherein the threaded sleeve includes the internally-threaded axial hole that mates with threads on the bolt, wherein the threaded sleeve and outer housing are composed of different materials, and wherein the outer housing has an axial hole and the threaded sleeve has a sleeve portion that fits inside the axial hole of the outer housing.

19. An ultrasonic transducer as recited in claim 18 wherein the threaded sleeve and the outer housing have mating contact surfaces on a plane perpendicular to an axis of the transducer.

20. An ultrasonic cleaning system as recited in claim 18 wherein the threaded sleeve and outer housing are bonded together using an epoxy with a ceramic filler.

21. An ultrasonic cleaning system as recited in claim 20 wherein the ceramic filler is aluminum oxide.

22. An ultrasonic cleaning system as recited in claim 20 wherein the epoxy is a polymer adhesive Supreme 10AOHT.

23. An ultrasonic transducer as recited in claim 18 wherein an outer diameter of the reduced diameter section of the sleeve portion of the threaded sleeve is substantially equal to an inner diameter of the one or more piezoelectric crystals.

24. An ultrasonic transducer as recited in claim 18 wherein the threaded sleeve is composed of titanium.

25. An ultrasonic transducer as recited in claim 18 wherein the threaded sleeve is composed of aluminum.

26. An ultrasonic transducer as recited in claim 18 wherein the outer housing is composed of silicon carbide.

* * * * *